United States Patent [19]

Yamazaki

[11] Patent Number: 4,651,182
[45] Date of Patent: Mar. 17, 1987

[54] INSULATED-GATE FIELD EFFECT TRANSISTOR AND METHOD OF FABRICATING THE SAME

[75] Inventor: Shunpei Yamazaki, Tokyo, Japan

[73] Assignee: Semiconductor Energy Laboratory Co., Ltd., Tokyo, Japan

[21] Appl. No.: 706,881

[22] Filed: Mar. 1, 1985

[30] Foreign Application Priority Data

Mar. 5, 1984 [JP] Japan ................................. 59-41755

[51] Int. Cl.$^4$ ............................................. H01L 29/78
[52] U.S. Cl. .................................. 357/23.4; 357/23.2; 357/23.3; 357/23.7; 357/52; 357/58
[58] Field of Search ................ 357/2, 23.2, 23.3, 23.4, 357/23.7, 58, 52

[56] References Cited

U.S. PATENT DOCUMENTS

| | | | |
|---|---|---|---|
| 4,470,060 | 9/1984 | Yamazoki | 357/23.4 |
| 4,568,958 | 2/1986 | Babga | 357/23.4 |

*Primary Examiner*—Martin H. Edlow
*Attorney, Agent, or Firm*—Gerald J. Ferguson, Jr.; Michael P. Hoffman; Ronni S. Malamud

[57] ABSTRACT

An insulated-gate field effect transistor (IGFET) having the structure of the source and drain disposed in the longitudinal direction, i.e., the laminating direction, so that the channel region extends in the lateral direction when a high voltage is applied. This structure prevents a high current density at the interface of the channel region and the gate insulation film, allowing the fabrication of a large-current power transistor or the integration of such transistors.

4 Claims, 10 Drawing Figures

INSULATED-GATE FIELD EFFECT TRANSISTOR AND METHOD OF FABRICATING THE SAME

BACKGROUND OF THE INVENTION (i) Field of the Invention

The present invention relates to an insulated-gate field effect transistor (will be termed simply IGFET hereinafter) and a composite semiconductor device made up of IGFETs and the method of fabricating the same.

(ii) Description of the Prior Art

The conventional IGFET has a lateral channel structure, and its basic elements include a source, drain and gate. The source and drain are disposed laterally on the surface of the substrate, and a current flowing between the source and drain is controlled with the gate located between the source and drain.

Fabrication of a large number of IGFETs having uniform characteristics in a wide area (20 cm by 30 cm or more) need the use of chemical vapor deposition, e.g., plasma chemical vapor deposition in which a semiconductor layer is formed at a temperature of up to 500° C. by utilization of glow or arc discharge. However, the semiconductor layer formed by the chemical vapor deposition (CVD) method is non-single crystal semiconductor, providing an extremely low carrier (electron and hole) mobility which is 1/10 to 1/100 of that of monocrystalline semiconductor, and therefore the channel length must be made smaller than 2 $\mu$m (preferably 0.1 to 1 $\mu$m) so that a complete device has a practical frequency response.

When the CVD method is used in the fabricating process for the conventional lateral channel structure in which the source and drain are disposed laterally, the accuracy of alignment is limited, and therefore it is difficult to make the channel length below 20 to 40 $\mu$m over a large area.

Non-single crystal semiconductor formed by the CVD method has an amorphous structure, a semi-amorphous structure having a quantum-theoretic orderly nature or fine crystalline nature of a size of 5 to 100 Å, or a micro-polycrystalline structure with crystals in a size of 100 to 2000 Å. However, non-single crystal semiconductor added by hydrogen or halogen such as fluorine has not as high density as monocrystalline semiconductor has. On this account, it is difficult to form a satisfactory pn junction, or to fabricate a semiconductor device with a breakdown voltage above 50 volts.

SUMMARY OF THE INVENTION

It is an object of the present invention to provide an insulated-gate field effect transistor (IGFET) having the structure of the source and drain disposed in the longitudinal direction, i.e., the laminating direction, in consideration of various characteristics of non-single crystal semiconductor (will be termed simply NSCS hereinafter), so that the channel region extends in the lateral direction when a high voltage is applied. This structure prevents a high current density at the interface of the channel region and the gate insulation film, allowing the fabrication of a large-current power transistor or the integration of such transistors.

The invention resides in the IGFET structure wherein the source and drain are disposed in the longitudinal direction, a stabilizing NSCS layer is formed following the formation of a protuberant portion, and subsequently a gate insulation film is formed without the substrate surface being exposed to the atmosphere, so that the interface state density at the interface of the gate insulation film and the semiconductor is made below $1 \times 10^{11}$ cm$^{-2}$ and, in addition, the threshold voltage (Vth) is adjusted by controlling the amount of additive boron in the semiconductor material. This structure allows the current to flow in the lateral and longitudinal directions in the channel region. In the inventive IGFET structure, the drain (or source) is formed in the first semiconductor layer which is overlaid by a multiplility of the second semiconductor layers so as to achieve a high breakdown voltage.

DETAILED DESCRIPTION OF THE INVENTION AND PREFERRED EMBODIMENTS OF THE INVENTION

Figure 1A:
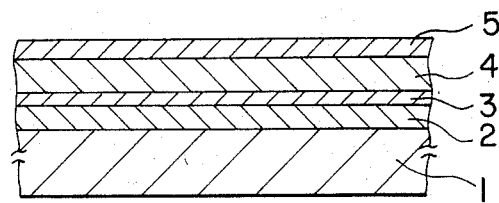
FIGS. 1 (A-D) and 2 (A-D) are sets of cross-sectional views showing part of the fabricating process (shown by A and B of both figures) and the complete structure (shown by C and D of both figures) of the insulated-gate field effect transistor (IGFET) according to the present invention.

The present invention will now be described by taking specific preferred embodiments.

EMBODIMENT 1:

In FIG. 1 showing part of the fabricating process of the inventive laminated IGFET (shown by A and B) and the cross section of the complete device (shown by C and D), an insulative substrate 1 (e.g., alumina, glass or glazed ceramic) is coated with a conductive transparent film (CTF) 2 in a thickness of 0.1 to 1.0 $\mu$m. For the CTF 2, a dual-layered film of ITO (a compound of indium oxide and tin oxide) and tin oxide, or a multiplicity thereof are used.

Next, the first N-type or P-type non-single crystal semiconductor (will be termed simply NSCS) layer 3 is formed on the CTF 2 by the plasma chemical vapor deposition (PCVD) method. This process is carried out by placing the substrate in a reaction chamber at 0.01 to 1.00 torr and at a temperature ranging from the room temperature to 500° C. (preferably 150° to 350° C.) and by generating a plasmatic glow discharge through the application of high-frequency energy by the capacitive or inductive method. In consequence, semiconductor generative gas, such as silicon fluoride ($SiF_2$, $Si_2F_6$, $SiF_4$) and silane ($SiH_4$, $Si_2H_6$), introduced in the reaction chamber resolves and couples to form a recombination center which is an unpaired coupler, and after it is neutralized in hydrogen or fluorine (halogen elements), the NSCS layer 3 (drain region) is formed. In this case, addition of phosphine of 0.01 to 2 atomic percent to the silicide gas causes the layer 3 to be N-type, or addition of diborane in the same percentage caues the layer 3 to be P-type.

Subsequently, the NSCS layer 3 is overlaid with the second NSCS layer (I-type layer) 4 of an intrinsic or virtually intrinsic conductivity type in a thickness of 0.1 to 3 $\mu$m. The formation of the I-type NSCS layer is carried out through the same process as in forming the previous semiconductor layer, but in this case without the addition of impurity such as phosphine (N-type impurity) and diborane (P-type impurity).

The breakdown voltage of the complete device can be improved by forming the second NSCS layer 4 in a multi-layer structure consisting of an I-type layer and P⁻-type layer; an I-type later and N⁻-type later; a P⁻-type later and I-type layer; an N⁻-type layer and I-type layer; an I-type layer and P⁻-type and I-type layer; an I-type layer and N⁻-type layer and I-type layer; a P⁻-type layer and I-type layer and P⁻-type layer; or an N⁻-type layer and I-type layer and N⁻-type layer, formed in this order seen from the side of the substrate 1.

In order to further enhance the breakdown voltage, the layer 4 may be formed of silicon carbide semiconductor ($Si_xC_{1-x}$, $0<x<1$, e.g., x=0.8 to 0.9). Our experimental result shows that the breakdown voltage can be improved to even higher than 50 volts. The method of creating silicon carbide semiconductor is described in U.S. patent application, Ser. No. 06/586,699, entitled "Semiconductor Photoelectric Conversion Device and Method", filed on Mar. 6, 1984 by the same applicant of the present invention.

Next, the layer 4 is overlaid with the third P-type or N-type NSCS layer 5 (source region) in the same method as for forming the first NSCS layer 3. The first and third NSCS layers 3 and 5 are of the same conductivity type.

Figure 1B:
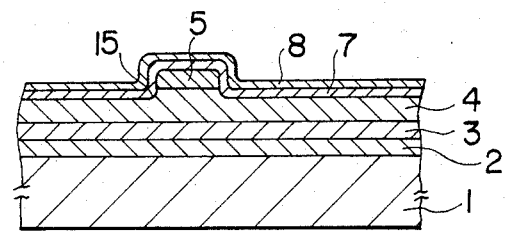

Subsequently, the third NSCS layer 5 is subjected to selective etching so that a protuberant portion is formed as shown in FIG. 1B. In this process, the surface of the second NSCS layer 4 is slightly etched.

The fourth NSCS layer 7 of an intrinsic (I-type) or semi-intrinsic (P⁻ or N⁻-type) conductivity type is formed to cover the protuberant portion, and it is further overlaid with a gate insulation film 8. The fourth NSCS layer 7 and gate insulation film 8 are formed by the PCVD method or photo-CVD method, without the semiconductor surface being exposed to the atmosphere. The gate insulation film is made of silicon nitride formed in a thickness of 100 to 2000 Å through a reaction between silane ($SiH_4$ or $Si_2H_6$) and hydrogen nitride ($NH_3$ or $N_2H_4$) by the PCVD method or photo-CVD method. By making the gate insulation film 8 to selectively include semiconductor clusters or thin films, the complete semiconductor device functions as a nonvolatile memory. The method of forming the gate insulation film 8 which selectively include semiconductor clusters or thin films is described in U.S. Pat. Nos. 3,856,587 and 3,878,549 by the same applicant of the present invention.

FIG. 1B shows the cross section of the semiconductor device on completion of the gate insulation film 8. In the figure, a corner section 15 is deep-etched into the second semiconductor layer 4. The purpose of forming the fourth NSCS layer 7 between the substrate and the gate insulation film 8 is to prevent the formation of low-grade oxide due to spontaneous oxidation of the etched surface, that can be a factor of instability, when the protuberant portion is formed on the substrate, thereby to enhance the interface characteristics. By controlling the quantity of additive boron in the process of forming the fourth NSCS layer 7, an arbitrary threshold voltage (Vth) can be established. As a practical example, through the addition of 20 PPM of boron to silane, the complete device has a threshold voltage ranging 2 to 3 volts.

After an opening 18 for making access to the third NSCS layer 5 has been formed, an electrode 9 made of ITO or metallic conductor (mainly including chromium, molybudenum, nickel, etc.) is deposited by the vacuum deposition method or PCVD method. The material for the gate electrode may be low-resistivity semiconductor of the same conductivity type as of the first and third NSCS layers 3 and 5.

Figure 1C:
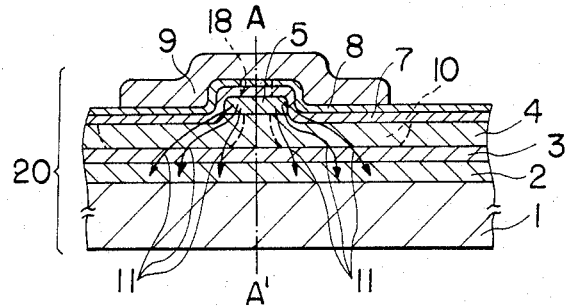
Figure 1D:
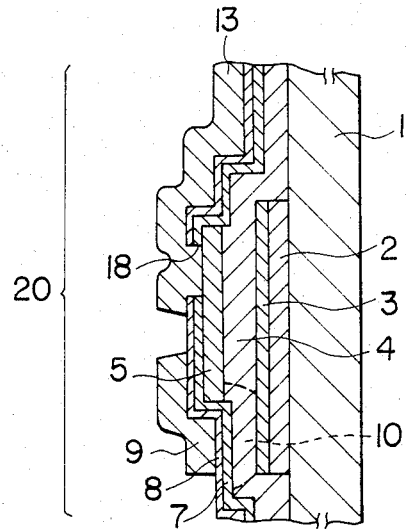

FIGS. 1C and 1D show the cross section of the semiconductor device with the conductive deposition being formed and, thereafter, etched off except for the portion used for the electrode 9. FIG. 1D shows the cross section taken along the line A to A' of FIG. 1C.

Through the foregoing process, the inventive IGFET 20 has the gate insulation film 8 beneath the gate electrode 9, the drain and source regions formed in the layers 3 and 5, respectively, and the channel region formed in the layer 4 (including part of the layer 7). By application of a voltage to the gate electrode 9, channel 10 is formed in the channel region. This causes a current to flow from the third NSCS layer 5 (source) to the first NSCS layer 3 (drain), the current once flaring outwardly, then flowing perpendicularly to the layers as shown by the arrows 11 in FIG. 1C. The current also flows in the layer 7, and on this account the current does not concentrate in the interface of the gate insulator and semiconductor. In consequence, the interface is not deteriorated even using NSCS material having an amorphous or semi-amorphous structure, and a reliable transistor can be manufactured.

As an additional process, following the formation of the gate insulation film 8, the fourth NSCS layer 7 may be treated with laser annealing through this insulation film using the YAG laser (pulsed beam) with a wavelength of 1.06 μm or excimer laser so that the fourth NSCS layer 7 is rendered monocrystalline or polycrystalline, whereby the complete device has a large-power performance.

Although the monocrystalline semiconductor has a size of 6 inches at maximum currently, the present invention using an NSCS material enables the formation of the NSCS film with a size of 20 cm by 30 cm or more, allowing the fabrication of a large number of IGFETs in a matrix configuration.

EMBODIMENT 2:

In FIG. 2 showing the second embodiment of the present invention, a substrate 1 is a sheet of metal such as stainless steel, chromium-nickel, molybdenum, and the like. The first NSCS layer 3 of N-type or P-type is formed in an ohmic contact to the top surface of the substrate 1 in the same method described in Embodiment 1. The layer 3 is overlaid with the second NSCS layer 4 in a thickness of 0.1 to 3 μm which constitutes part of the channel region. In this case, for example, the semiconductor layer 3 is N-type and, correspondingly, the layer 4 is P⁻-type, I-type, N-type or a combination of these types. The layer 4 is further overlaid with the third NSCS layer 5 of the same conductivity type as of the first semiconductor layer by the CVD method.

Subsequently, a conductive film 6 made of molybdenum, tungsten, tungsten silicide, ITO, or the like is formed over the layer 5 in a thickness of 0.1 to 1 μm, and it is overlaid with a silicon oxide insulation film 7A in a thickness of 0.3 to 2 μm for reducing the parasitic capacitance by the PCVD method.

Figure 2A:
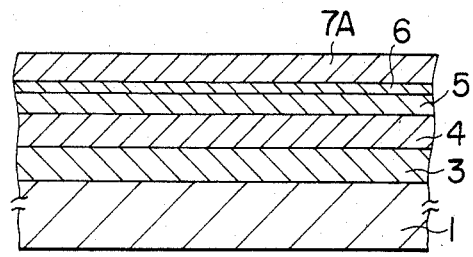
Figure 2B:
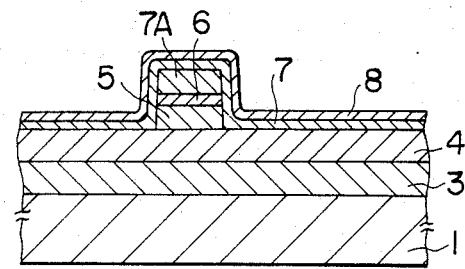
Figure 2C:
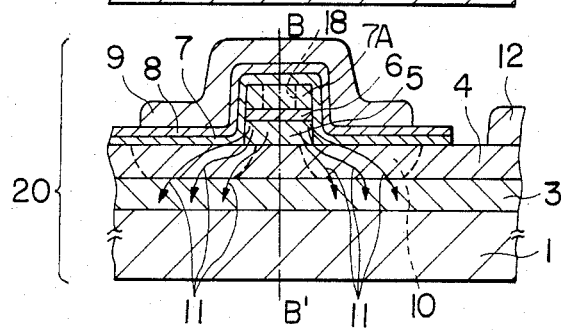

Thereafter, the insulation film 7A, conductive layer 6 and the third semiconductor layer 5 are etched off as shown in FIG. 2B.

Next, the fourth NSCS layer 7 and a gate insulation film 8 are formed in a thickness of 0.1 to 1 μm by the PCVD method or photo-CVD method. The device can be modified into a large-current power transistor by the successive process in which a laser beam or intense light beam is projected through the gate insulation film 8 onto the substrate so that it is heated to 200° to 300° C., thereby converting the fourth NSCS layer 7 (also part of the second NSCS layer 4) into monocrystalline or polycrystalline.

Figure 2D:
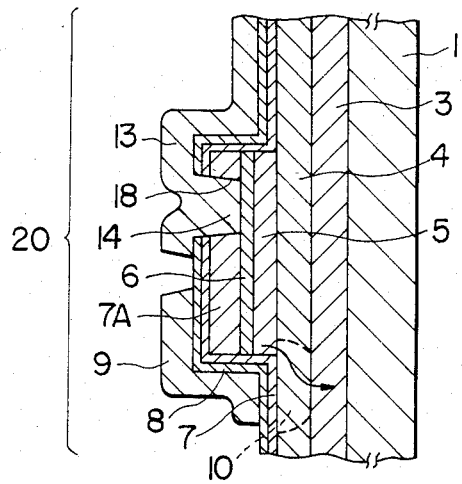

Following the formation of the gate insulation film 8, an electrode opening 18 is formed, and then a gate electrode 9 made of a conductive layer, e.g., ITO, $TiSi_2$, $WSi_2$ and Mo, or N+- or P+-type polycrystalline silicon semiconductor layer is formed. A channel region is formed in the second NSCS layer 4 and part of the fourth NSCS layer 7. The current flows from the source 5 down to the drain 3, while flaring laterally in a wide region as shown by 11 in FIG. 2C. FIG. 2D is a cross section taken along the line B to B' of FIG. 2C.

As can be seen from the drawing, the first NSCS layer 3 is formed in ohmic contact with the conductive substrate 1, the third NSCS layer 5 is overlaid with the conductive layer 6 for reducing the sheet resistance, and a source electrode 14 with an accompanying lead 13 is formed in the opening 18. Although in the above embodiment the gate electrode 9 and source lead 13 are formed in one process using the same material, they may be formed of different materials with an inter-layer insulator such as polyimide resin provided between the electrodes 9 and 13 to form multilayer wirings. The gate insulation film 8 and remaining sections are fabricated in the same processing steps as those of Embodiment 1.

Figure 3A:
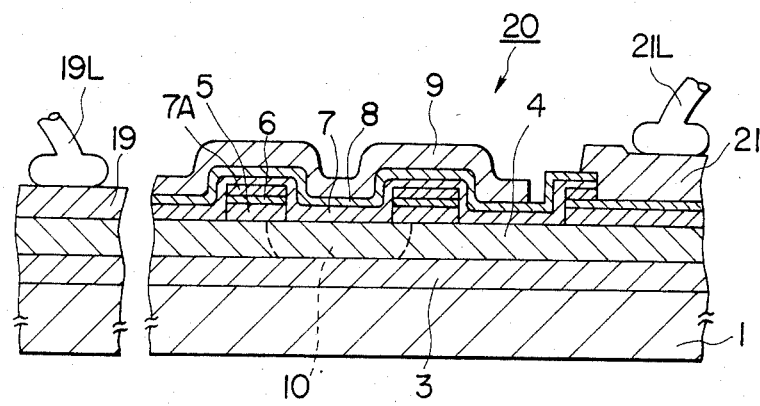
FIG. 3 (A and B) is a set of cross-sectional and plane views showing a power transistor made up of numerous IGFETs formed on a single substrate.
Figure 3B:
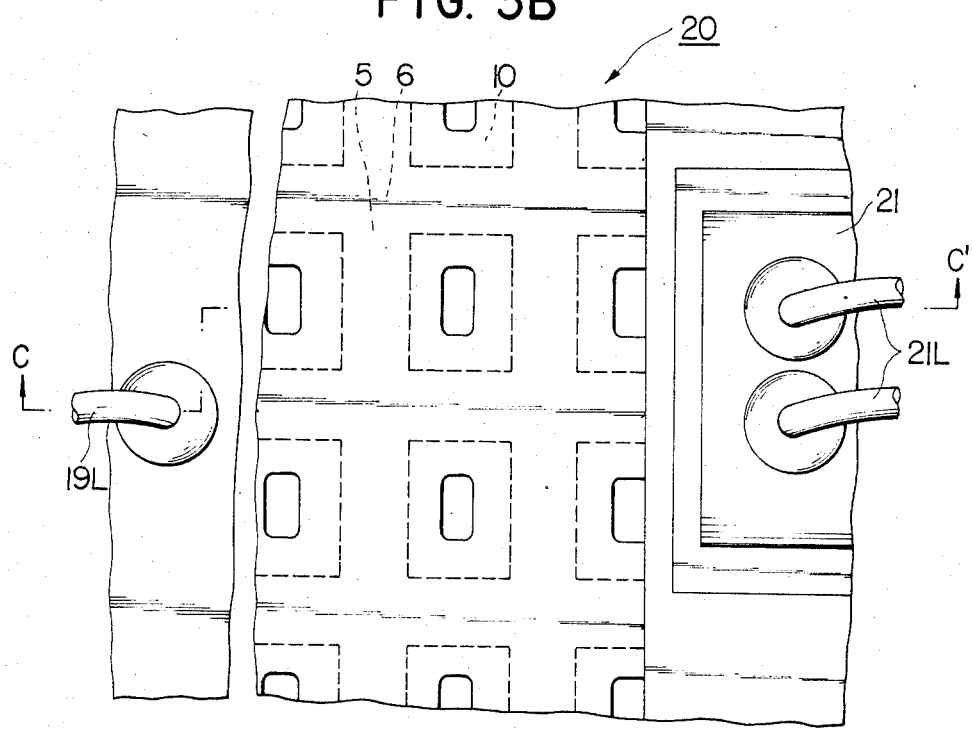

EMBODIMENT 3:

FIG. 3 shows an example of the structure of a power transistor constructed using a multiplicity of inventive IGFET. FIG. 3B is a plane view, and FIG. 3A is a longitudinal cross-sectional view taken along the line C to C' of FIG. 3B.

In FIG. 3A, the first N-type NSCS layer 3 on a conductive substrate 1 constitutes the drain. A channel region 10 is formed in the second and fourth NSCS layers 4 and 7, and the layer 7 is overlaid with a gate insulation film 8. The third NSCS layer 5 is overlaid with a conductive layer 6, forming a lamination of the same shape, and a gate electrode 9 is formed to cover these source and channel regions.

As can be seen from the drawing, the gate electrode is linked with an external lead-out electrode 19 (lead 19L), and the source 5 is connected with the conductive layer 6 and further linked with an external lead-out electrode 21 (lead 21L). Because of a large current of 0.1 to 10 amperes flowing between the source 5 and drain 3, two lead wires 21L are bonded on the source lead-out electrode 21 as shown in FIG. 3B.

The foregoing arrangement allows a 20 to 40% area of non-single crystal semiconductor to form the source region, a 60 to 40% area to form the channel region, and about 20% area to form the external lead-out electrode and scribe line sections. For example, a complete device with a chip area of 5 to 10 mm by 5 to 10 mm functions as a power IGFET dealing with a current as large as 20 amperes. Moreover, the second NSCS layer 4 can be provided with an intrinsic or virtually intrinsic conductivity, and the drain withstand voltage can be 50 volts or more.

As will be appreciated from the foregoing description of Embodiments 1 through 3, the inventive IGFET is formed using non-single crystal semiconductor laminated on the conductive substrate or conductive layer, instead of using the conventional monocrystalline semiconductor.

The present invention is particularly advantageous for reducing the sheet resistance, since the use of semi-amorphous semiconductor of N or P type having a fine crystalizing property of 5 to 100 Å in the non-single crystal achieves the conductivity of 1 to 100 $(\Omega cm)^{-1}$ or 0.1 to 10 $(\Omega cm)^{-1}$, that is 10 to $10^3$ times higher than that of amorphous. For intrinsic or virtually intrinsic semiconductor, so-called semi-amorphous semiconductor showing the quantum theoretic orderly crystalizing property of 5 to 100 Å can be made from silicon semiconductor by maintaining the oxygen concentration, which works as an agent of amorphism, below $5 \times 10^{18}$ $cm^{-3}$. Such semiconductor can be made to have an electric conductivity (dark conductivity) of $10^{-8}$ to $10^{-4} (\Omega cm)^{-1}$, or $1 \times 10^{-3}$ to $9 \times 10^{-2} (\Omega cm)^{-1}$ at 100 $mW/cm^2$, as well as an improved carrier mobility $\frac{1}{2}$ to 1/30 that of single-crystal silicon. The use of this semiconductor material for the inventive IGFET is significantly effective.

What is claimed is:

1. An insulated-gate field effect semiconductor device comprising:
    a first semiconductor layer (3) of one conductivity type formed on a substrate (1) or a conductive layer (2) on said substrate;
    a second semiconductor layer (4) of an intrinsic or virtually intrinsic conductivity type having a channel region therein and formed on said first semiconductor layer (3);
    a third semiconductor layer (5) having the same conductivity type as that of said first semiconductor layer (3) and formed protuberantly on said second semiconductor layer (4);
    a fourth semiconductor layer (7) of an intrinsic or virtually intrinsic conductivity type formed to cover said second and third semiconductor layers;
    a gate insulation film (8) formed on said fourth semiconductor layer; and
    a gate electrode provided on said gate insulation film.

2. A semiconductor device according to claim 1, wherein said third semiconductor layer (5) is overlaid with a metallic conductive layer (7A), said conductive layer being covered with an insulation film.

3. A semiconductor device according to claim 1, wherein said semiconductor layers are made of non-single crystal semiconductor mainly including amorphous semiconductor added by hydrogen or halogen element such as fluorine, or semi-amorphous semiconductor having an orderly or crystalizing property in a size of 5 to 100 Å.

4. A semiconductor device according to claim 1, wherein said fourth semiconductor layer (7) is made of monocrystalline or polycrystalline semiconductor.

* * * * *